(12) United States Patent
Cheng et al.

(10) Patent No.: US 7,713,814 B2
(45) Date of Patent: May 11, 2010

(54) HYBRID ORIENTATION SUBSTRATE COMPATIBLE DEEP TRENCH CAPACITOR EMBEDDED DRAM

(75) Inventors: Kangguo Cheng, Guilderland, NY (US); Ramachandra Divakaruni, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 133 days.

(21) Appl. No.: 11/969,502

(22) Filed: Jan. 4, 2008

(65) Prior Publication Data

US 2009/0176347 A1 Jul. 9, 2009

(51) Int. Cl.
*H01L 21/8242* (2006.01)

(52) U.S. Cl. .............. 438/243; 257/E21.008; 438/244; 438/245; 438/246; 438/247; 438/248

(58) Field of Classification Search .......... 438/241, 438/243
See application file for complete search history.

(56) References Cited

U.S. PATENT DOCUMENTS

| | | | | |
|---|---|---|---|---|
| 6,018,174 A * | 1/2000 | Schrems et al. | ............. | 257/296 |
| 6,037,208 A * | 3/2000 | Wei | ............. | 438/243 |
| 6,093,614 A * | 7/2000 | Gruening et al. | ............. | 438/388 |
| 6,271,079 B1 * | 8/2001 | Wei et al. | ............. | 438/243 |
| 6,297,088 B1 * | 10/2001 | King | ............. | 438/243 |
| 6,429,477 B1 * | 8/2002 | Mandelman et al. | ............. | 257/301 |
| 6,489,646 B1 * | 12/2002 | Jang | ............. | 257/296 |
| 6,566,177 B1 | 5/2003 | Radens et al. | | |
| 6,773,983 B2 * | 8/2004 | Richter et al. | ............. | 438/243 |
| 6,797,636 B2 * | 9/2004 | Tews et al. | ............. | 438/706 |
| 6,974,991 B2 * | 12/2005 | Cheng et al. | ............. | 257/302 |
| 7,132,324 B2 * | 11/2006 | Cheng et al. | ............. | 438/243 |
| 2001/0029077 A1 * | 10/2001 | Noble et al. | ............. | 438/257 |
| 2003/0057487 A1 * | 3/2003 | Yamada et al. | ............. | 257/347 |
| 2004/0032027 A1 * | 2/2004 | Popp et al. | ............. | 257/758 |
| 2005/0277264 A1 * | 12/2005 | Cheng et al. | ............. | 438/433 |
| 2006/0046399 A1 * | 3/2006 | Lindert et al. | ............. | 438/282 |
| 2006/0105536 A1 * | 5/2006 | Cheng et al. | ............. | 438/386 |
| 2006/0202249 A1 * | 9/2006 | Cheng et al. | ............. | 257/301 |

* cited by examiner

*Primary Examiner*—Charles D Garber
*Assistant Examiner*—Pape Sene
(74) *Attorney, Agent, or Firm*—Scully, Scott, Murphy & Presser, P.C.; Joseph P. Abate, Esq.

(57) ABSTRACT

Method of limiting the lateral extent of a trench capacitor by a dielectric spacer in a hybrid orientations substrate is provided. The dielectric spacer separates a top semiconductor portion from an epitaxially regrown portion, which have different crystallographic orientations. The deep trench is formed as a substantially straight trench within the epitaxially regrown portion such that part of the epitaxially regrown portion remains overlying the dielectric spacer. The substantially straight trench is then laterally expanded to form a bottle shaped trench and to provide increased capacitance. The lateral expansion of the deep trench is self-limited by the dielectric spacer above the interface between the handle substrate and the buried insulator layer. During subsequent formation of a doped buried plate, the dielectric spacer blocks diffusion of dopants into the top semiconductor portion, providing a compact bottle shaped trench capacitor having high capacitance without introducing dopants into the top semiconductor portion.

8 Claims, 10 Drawing Sheets

HYBRID ORIENTATION SUBSTRATE COMPATIBLE DEEP TRENCH CAPACITOR EMBEDDED DRAM

FIELD OF THE INVENTION

The present invention relates to semiconductor structures, and particularly to an embedded dynamic random access memory (eDRAM) employing a deep trench capacitor and formed in a hybrid orientation substrate, and methods of manufacturing the same.

BACKGROUND OF THE INVENTION

Deep trenches, typically having a depth exceeding 1 micrometer, or 1 micron, in contrast to shallow trenches having a depth less than 1 micron, are employed in the semiconductor industry to provide a variety of useful devices including a deep trench capacitor. The deep trenches may be utilized in a stand-alone semiconductor circuit such as a dynamic random access memory (DRAM) circuit to provide deep trench capacitors, or may be utilized as an embedded circuit component of a semiconductor chip that also includes other semiconductor circuits such as a processor core or other logic circuits. Particularly, embedded capacitors employing a deep trench are employed to enable an embedded memory device, e.g., an embedded dynamic random access memory (eDRAM) cell, a passive component of a radio frequency (RF) circuit, and decoupling capacitors that provide a stable voltage supply in a semiconductor circuit.

Hybrid orientation technology (HOT) provides multiple crystallographic orientations on the same semiconductor substrate. Specifically, a semiconductor-on-insulator (SOI) substrate containing a handle substrate, a buried insulator layer, and a top semiconductor layer is employed to form a hybrid orientation substrate. The handle substrate has the first crystallographic orientation, and the top semiconductor layer has a second crystallographic orientation, which is different from the first crystallographic orientation. An area of the SOI substrate is patterned to form a trench by removing a stack of the top semiconductor layer and the buried insulator layer and exposing the underlying handle substrate. After formation of dielectric spacers on the side walls of the trench, an epitaxially regrown semiconductor portion having the first crystallographic orientation is formed on the exposed portions of the handle substrate. Thus, a hybrid orientation substrate comprises two types of single crystalline surfaces having different crystallographic orientations. Differences in the two types of single crystalline surfaces may be advantageously employed to provide enhanced performances in semiconductor devices. For example, p-type field effect transistors may be formed on one type of single crystalline surface, while n-type field effect transistors may be formed on the other type of single crystalline surface.

High performance logic chips are frequently manufactured on an SOI substrate to provide enhanced performance over devices having comparable dimensions and manufactured on a bulk substrate. However, incorporation of embedded capacitors into the SOI substrate requires not only formation of deep trenches in the SOI substrate but also formation of a buried plate beneath a buried insulator layer, while preventing diffusion of dopants into a top semiconductor layer above the buried insulator layer. This problem is not alleviated even on a hybrid orientation substrate. Particularly, it is necessary to prevent diffusion of dopants into the top semiconductor layer to form a compact eDRAM cell. A spacer can be formed on the trench sidewall of the top semiconductor layer to prevent diffusion of dopants (see U.S. Pat. No. 6,566,177 to Radens et al., for example), but the spacer is susceptible to erosion during deep trench etch and consequently the integrity of the spacer is compromised.

In view of the above, there exists a need for a compact embedded dynamic random access memory (eDRAM) structure employing a deep trench capacitor compatible with a hybrid orientation substrate, and methods of manufacturing the same.

SUMMARY OF THE INVENTION

The present invention addresses the needs described above by providing on embedded dynamic random access memory containing a deep trench capacitor formed in an epitaxially regrown semiconductor portion adjacent to a dielectric spacer abutting a top semiconductor portion such that the lateral extent of the deep trench is a self-limited by the dielectric spacer.

In the present invention, method of limiting the lateral extent of a trench capacitor by a dielectric spacer in a hybrid orientations substrate is provided. The dielectric spacer separates a top semiconductor portion from an epitaxially regrown portion, which have different crystallographic orientations. A deep trench is formed in two stages. In the first stage, the deep trench is formed as a substantially straight trench within the epitaxially regrown portion such that part of the epitaxially regrown portion remains overlying the dielectric spacer. In the second stage, the substantially straight trench is laterally expanded to form a bottle shaped trench and to provide increased capacitance. The lateral expansion of the deep trench is self-limited by the dielectric spacer above the interface between the handle substrate and the buried insulator layer. During subsequent formation of a doped buried plate, the dielectric spacer blocks diffusion of dopants into the top semiconductor portion, providing a compact bottle shaped trench capacitor having high capacitance without introducing dopants into the top semiconductor portion.

According to the present invention, a method of forming a deep trench capacitor is provided, which comprises:

providing a hybrid orientations substrate comprising a handle substrate having a first crystallographic orientation, a buried insulator layer vertically abutting the handle substrate, a top semiconductor portion having a second crystallographic orientation and vertically abutting the insulator layer, a dielectric spacer laterally abutting the buried insulator layer and the top semiconductor portion, and an epitaxial semiconductor portion having the first crystallographic orientation, epitaxially aligned to and vertically abutting the handle substrate, and laterally abutting the dielectric spacer;

forming a substantially straight trench in the epitaxial semiconductor portion and the handle substrate, wherein a part of the epitaxially regrown portion remains overlying the dielectric spacer; and laterally expanding the substantially straight trench by removal of material in the epitaxial semiconductor portion and the handles substrate to form a bottled shaped trench, wherein a lateral extent of the bottled shaped trench is limited by the dielectric spacer above an interface between the handle substrate and the buried insulator layer, and wherein of sidewall of the bottles shaped trench laterally extends beyond an outer sidewall of the dielectric spacer below the interface.

In one embodiment, the method further comprises forming a buried plate by introducing electrical dopants into a portion of the handle substrate and the epitaxial semiconductor portion located directly on sidewalls of the bottle shaped trench, wherein the dielectric spacer blocks diffusion of the electrical dopants into the top semiconductor portion.

In another embodiment, the electrical dopants are introduced by outdiffusion from a doped silicate glass formed directly on the sidewalls, by gas phase doping, or by plasma doping.

In even another embodiment, the method further comprises:

forming a node dielectric on the sidewalls;

forming a first conductive material portion on the node dielectric in the bottle shaped trench, wherein a top surface of the first conductive material portion is located between a top surface of the buried insulator layer and a bottom surface of the buried insulator layer;

removing the node dielectric and the dielectric spacer from above the top surface of the first conductive material portion; and forming a second conductive material portion abutting the first conductive material portion and the top semiconductor portion in an upper portion of the bottles shaped trench.

In yet another embodiment, the method further comprises undercutting a portion of the buried insulator layer directly beneath the top semiconductor portion, wherein the second conductive material portion vertically abuts a portion of that the top semiconductor portion.

In still another embodiment, the handle substrate, the top semiconductor layer, and the epitaxial semiconductor portion comprise silicon and the first crystallographic orientation is a (110) orientation and the second crystallographic orientation is a (100) orientation.

In a further embodiment, the method further comprises:

forming another epitaxial semiconductor portion having the first crystallographic orientation;

forming a first field effect transistor of a first conductivity type on the top semiconductor portion; and forming a second field effect transistor of a second conductivity type on another epitaxial semiconductor portion, wherein the second conductivity type is the opposite of the first conductivity type.

In a yet further embodiment, the dielectric spacer comprises silicon nitride.

In a still further embodiment, the epitaxial semiconductor portion is formed by selective epitaxial growth.

DETAILED DESCRIPTION OF THE INVENTION

Figure 1:
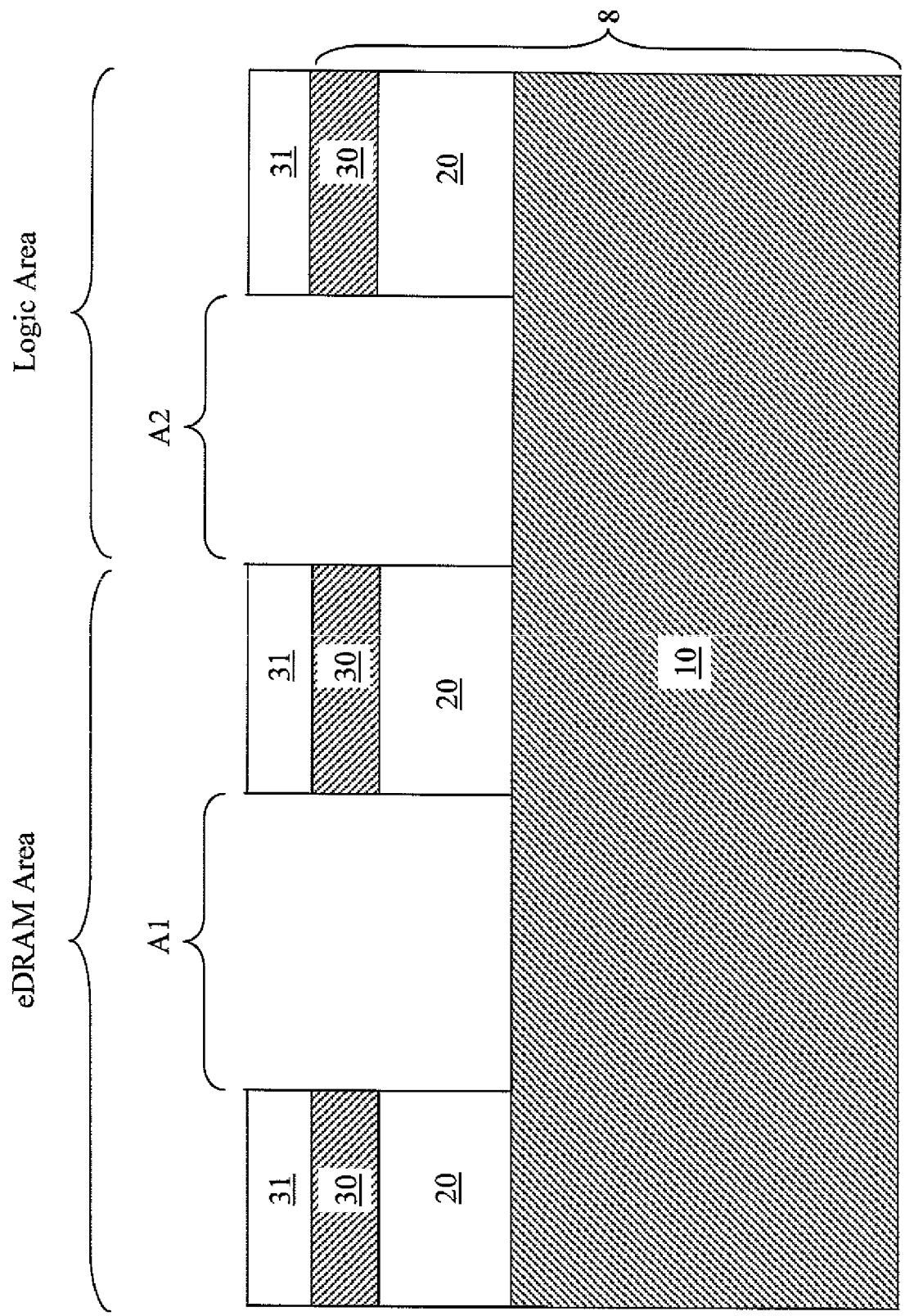
FIGS. 1-10 are sequential vertical cross-sectional views of an exemplary semiconductor structure according to the present invention.

As stated above, the present invention relates to a dynamic random access memory (DRAM) or an embedded dynamic random access memory (eDRAM) employing a deep trench capacitor and formed in a hybrid orientation substrate, and methods of manufacturing the same, which are now described in detail with accompanying figures. It is noted that like and corresponding elements mentioned herein and illustrated in the drawings are referred to by like reference numerals.

Referring to FIG. 1, an exemplary semiconductor structure according to the present invention comprises a semiconductor substrate 8. The semiconductor substrate 8 contains a handle substrate 10, a buried insulator layer 20, and top semiconductor portions 30. Each of the handle substrate 10 and the top semiconductor portions 30 comprises a semiconductor material, which may be selected from, but is not limited to, silicon, germanium, a silicon-germanium alloy, a silicon carbon alloy, a silicon-germanium-carbon alloy, gallium arsenide, indium arsenide, indium phosphide, III-V compound semiconductor materials, II-VI compound semiconductor materials, organic semiconductor materials, and other compound semiconductor materials. The handle substrate 10 comprises a first single crystalline semiconductor material having a first crystallographic orientation. The top semiconductor portions 30 comprise a second single crystalline semiconductor material having a second crystallographic orientation, which is different from the first crystallographic orientation. The handle substrate 10 and the top semiconductor portions 30 may comprise the same semiconductor material, or may comprise different semiconductor materials. For example, handle substrate 10 and the top semiconductor portions 30 may comprise silicon.

The handle substrate 10 may be undoped, or may have a p-type doping or an n-type doping at a low to medium level dopant concentration from about $1.0 \times 10^{13}/cm^3$ to about $3.0 \times 10^{17}/cm^3$. The thickness of the top semiconductor portions 30 may be from about 5 nm to about 300 nm, and preferably from about 20 nm to about 100 nm. The top semiconductor portions 30 may have a built-in biaxial stress in a horizontal plane, i.e., in the plane parallel to the interface between the buried insulator layer 20 and the top semiconductor portions 30. The buried insulator layer 20 comprises a dielectric material such as silicon oxide and/or silicon nitride. For example, the buried insulator layer 20 may comprise thermal silicon oxide. The thickness of the buried insulator layer 20 may be from about 20 nm to about 500 nm, and typically from about 100 nm to about 200 nm. The handle substrate 10, the buried insulator layer 20, and the top semiconductor portions 30 are provided from a semiconductor-on-insulator (SOI) substrate.

A hardmask layer 31 comprising a dielectric material is formed on top services of the top semiconductor portions 30. The hardmask layer 31 may comprises silicon oxide, silicon nitride, or a combination thereof.

A portion of the semiconductor substrate 8 is used to form logic devices and another portion of the hybrid substrate 8 is used to form embedded dynamic random access memory (eDRAM) devices. The portion in which logic devices are to be formed is herein referred to as a "logic area," and the portion in which eDRAM devices are to be formed is herein referred to as an "eDRAM area." A photoresist (not shown) is applied onto a top surface of the hardmask layer 31 and is lithographically patterned to expose a first area A1 in the eDRAM area and a second area A2 in the logic area, while covering the rest of the hardmask layer 31. The portions of the hardmask layer 31, the top semiconductor portions 30, and the buried insulator layer 20 within the first area A1 and the second area A2 are removed by an anisotropic etch employing the hardmask layer 31 as an etch mask. Portions of the top surface of the handle substrate 10 are exposed within the first area A1 and the second area A2 after the anisotropic etch.

Figure 2:
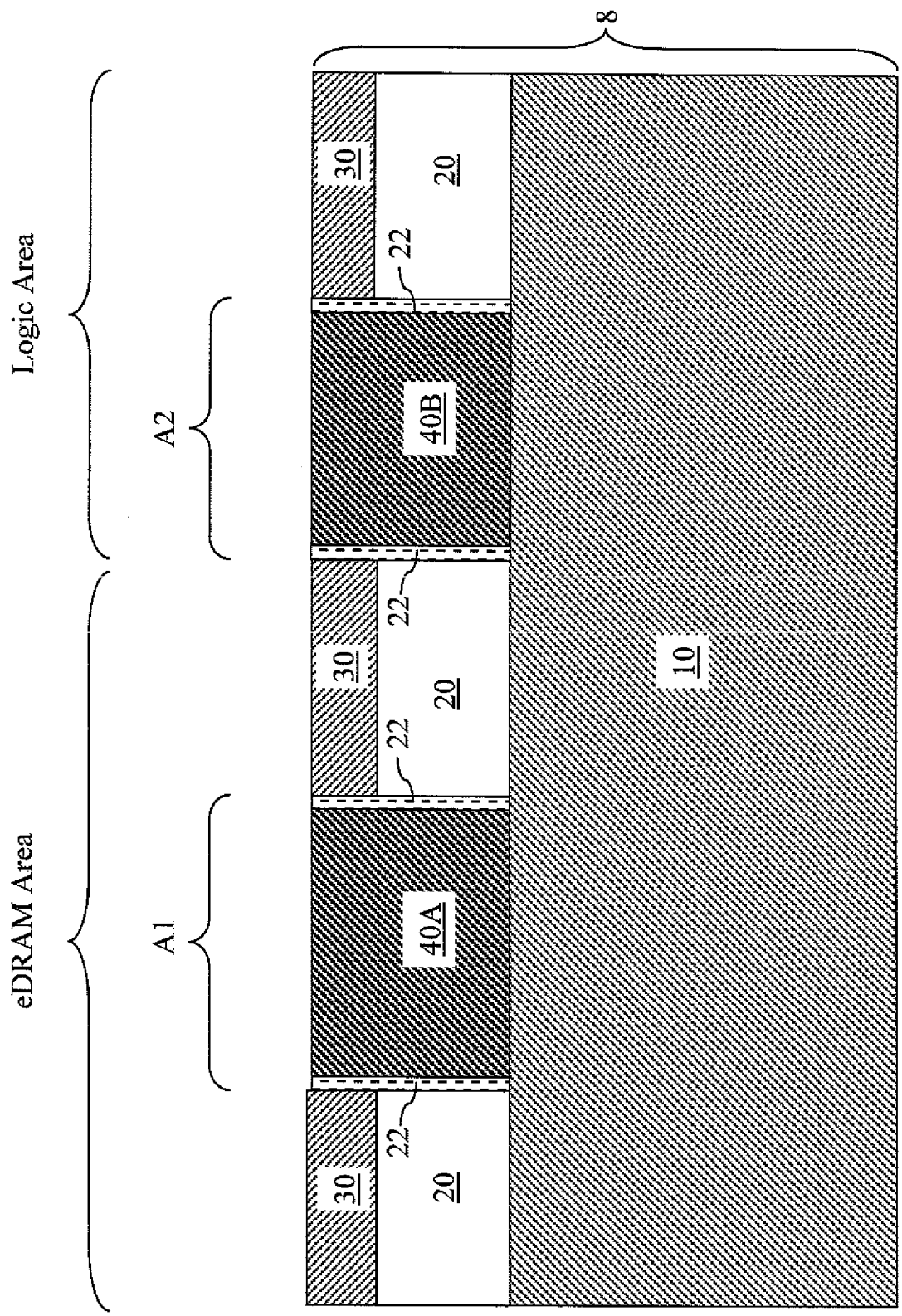

Referring to FIG. 2, dielectric spacers 22 are formed on the sidewalls of the buried insulator layer 20 and top semiconductor portions 30 by depositing a conformal dielectric layer (not shown) followed by an anisotropic etch. The conformal dielectric layer comprises a dielectric material such as a nitride, an oxide, or a combination thereof. The conformal dielectric layer functions as a diffusion barrier layer for electrical dopants. For example, the conformal dielectric layer comprises silicon nitride. The thickness of the conformal dielectric layer, which is the same as the thickness of the dielectric spacers 22, may be from about 3 nm to about 100 nm, and typically from about 5 nm to about 20 nm, although lesser and greater thicknesses are explicitly contemplated herein.

A first epitaxial semiconductor portion 40A and a second epitaxial semiconductor portion 40B are formed in the eDRAM area and in the logic area, respectively. Preferably, selective epitaxy is employed to grow a semiconductor material epitaxially within the first area A1 and the second area A2, while suppressing nucleation of semiconductor material on dielectric services including the dielectric spacers 22 and the hardmask layer 31. The epitaxially grown semiconductor material is planarized and/or recessed employing the hardmask layer 31 as a stopping layer during chemical mechanical planarization and/or an etch stop layer during an etch so that top surfaces of the remaining portions of the epitaxially grown semiconductor material are substantially coplanar with the top surfaces of the top semiconductor portions 30. The first epitaxial semiconductor portion 40A and the second epitaxial semiconductor portion 40B are epitaxially aligned to the handle substrate 10.

Figure 3:
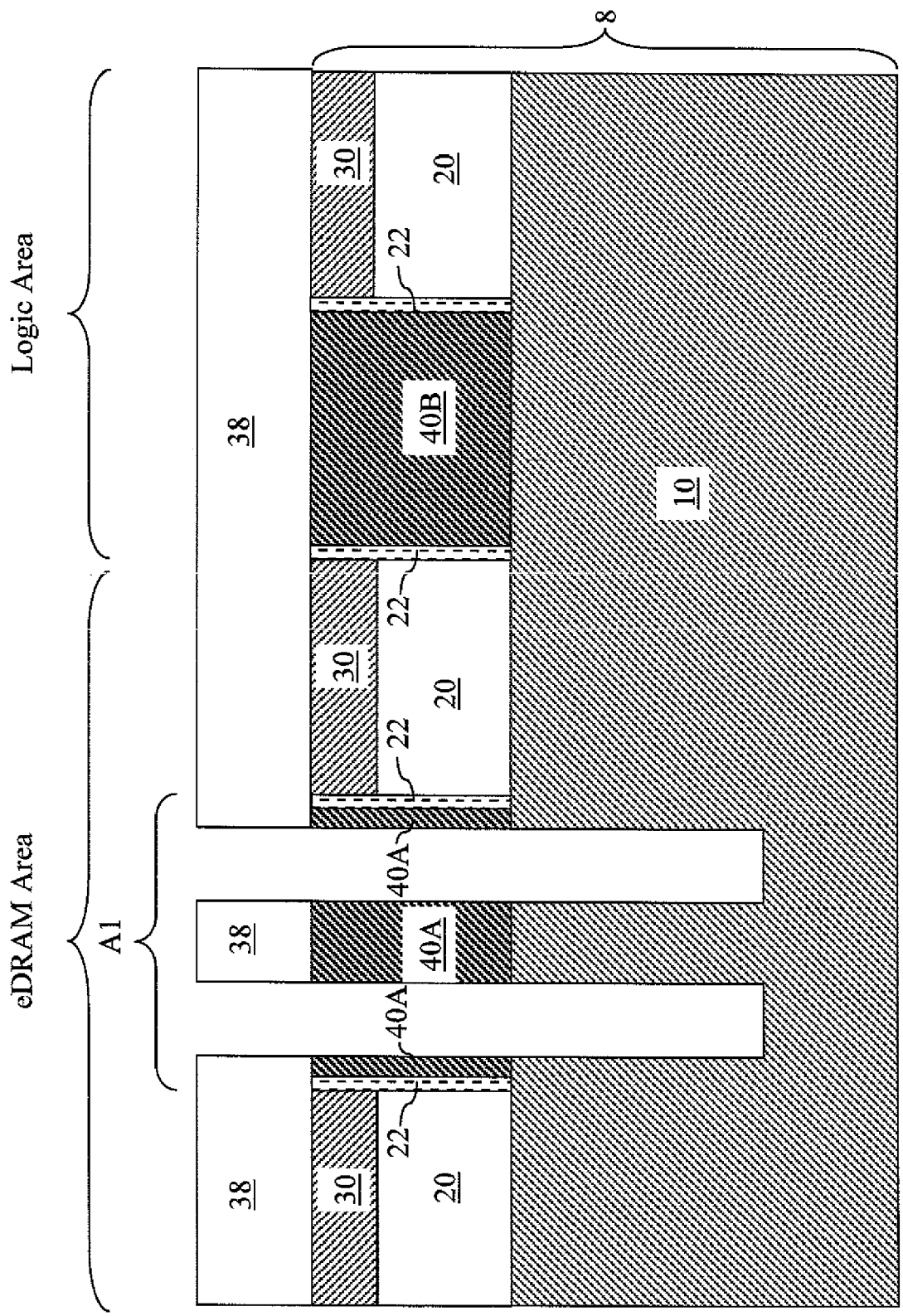

Referring to FIG. 3, at least one pad layer 38 is formed on the top surfaces of the top semiconductor portions 30, the first epitaxial semiconductor portion 40A, and the second epitaxial semiconductor portion 40B. Additional etch mask layers (not shown), which typically comprise a dielectric material such as borosilicate glass (BSG) or undoped silicate glass (USG), may be formed as needed. The at least one pad layer 38 comprises a dielectric material such as silicon oxide, silicon nitride, or a combination thereof. A photoresist (not shown) is applied on the at least one pad layer 38, and is lithographically patterned to define a pair of substantially straight trenches. The pattern in the photoresist is transferred into the at least one pad layer 38, the first epitaxial semiconductor portion 40A, and the handle substrate 10 by an anisotropic etch to form substantially straight trenches.

A substantially straight trench herein denotes a trench having substantially straight sidewalls extending from a top surface of the hybrid substrate 8 to bottom surfaces of the substantially straight trench without any lateral jog. Thus, the substantially straight trench is not a bottle shaped trench. The substantially straight trench may be straight, thus having vertical sidewalls or sidewalls having a substantially constant taper angle, which is less than 5 degrees, and more typically, less than 2 degrees. The substantially straight trench may have sidewalls having a small curvature, or variations in the taper angle, which is less than 5 degrees, and typically less than 2 degrees. Thus, the width of the substantially straight trench is a monotonically decreasing function of depth from the top surface of the hybrid substrate 8, i.e., constant or decreasing with the depth from the top surface of the hybrid substrate 8.

The photoresist and/or the additional etch mask layers are employed as an etch mask during the anisotropic etch, which is typically an anisotropic reactive ion etch. Chemistry for etching a deep trench employing an etch mask is well known in the art. Remaining portions of the photoresist and/or the additional etch mask layers are removed after the anisotropic etch. The depth of the substantially straight trenches, as measured from the top surface of the top semiconductor portions 30 to the bottom surface of the deep trenches, may be from about 1 micron to about 10 microns, and typically from about 2.5 microns to about 8 microns. The sidewalls of the substantially straight trenches are substantially vertical and extends from a top surface of the at least one pad layer 38 to the bottom surface of the substantially straight trenches.

The substantially straight trenches are placed such that all sidewalls of the substantially straight trenches are located within the first epitaxial semiconductor portion 40. A sidewall of each substantially straight trench is placed in proximity to a dielectric spacer 22, in which the distance between the sidewall and the dielectric spacer 22 is greater than zero and is less than a lateral extent of the etch to be subsequently performed to enlarge each substantially straight trench into a bottle shaped trench. This distance may be from about 1 nm to about 100 nm, and preferably from about 5 nm to about 20 nm. Preferably, this distance is greater than the overlay tolerance of the lithographic process employed to pattern the substantially straight trenches to insure that the dielectric spacers 22 are not exposed thus to avoid undesired damage of the dielectric during the formation of the substantially straight trenches.

Figure 4:
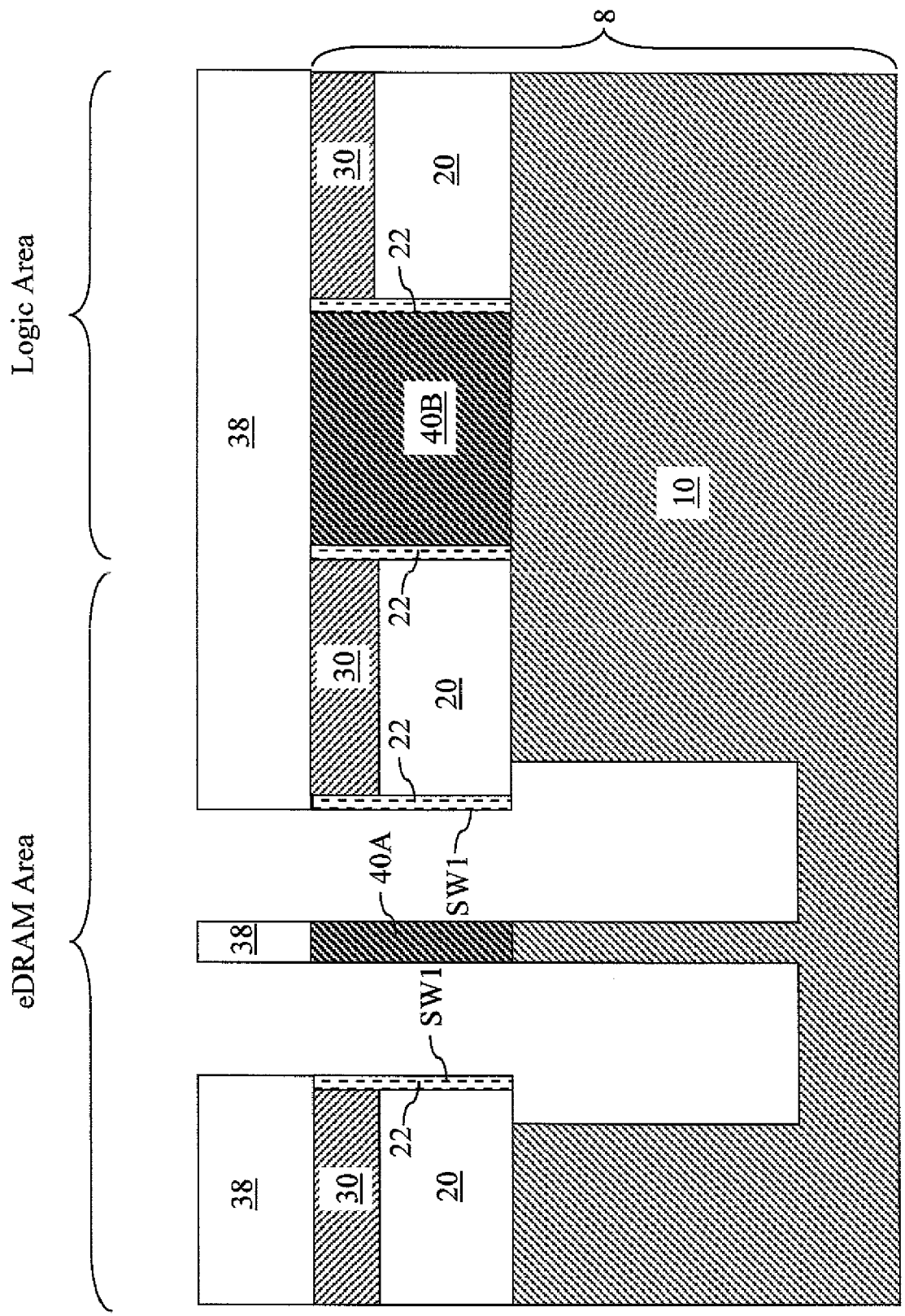

Referring to FIG. 4, the substantially straight trenches are expanded by an isotropic etch both laterally and vertically. The isotropic etch may be a wet etch (e.g., a wet etching solution with an etchant containing ammonia) or a dry etch (e.g., chemical downstream etch or plasma etch). The isotropic etch is selective to the dielectric spacers 22 and at least one pad layer 38. During the isotropic etch, the lateral extent of the expansion of the substantially straight trenches is a limited by the dielectric spacers 22 above the interface between the handle substrate 10 and the buried insulator layer 20. The isotropic etch is self-limited by the dielectric spacers 22, and consequently, a sidewall, which is herein referred to a first sidewall SW1, of each trench derived from one of the substantially straight trenches coincides with the dielectric spacers 22.

However, the lateral extent of the expansion of the substantially straight trenches is not limited by any dielectric spacer below the interface between the handle substrate 10 and the buried insulator layer 20. A sidewall of substantially straight trench laterally expands past an outer surface of one of the dielectric spacers 22 during the isotropic etch. Thus, each substantially straight trench becomes a bottle shaped trench after the isotropic etch. Each bottle shaped trench comprises a first sidewall SW1 located above the interface between the handle substrate 10 and the buried insulator layer 20 and coinciding with an outer surface of a dielectric spacer 22 and a second sidewall SW2 located below the interface between the handle substrate 10 and the buried insulator layer 20 and vertically offset from the first sidewall SW1 by an offset distance. The offset distance may be from about 1 nm to about 100 nm, and typically is from about 5 nm to about 20 nm.

Figure 5:
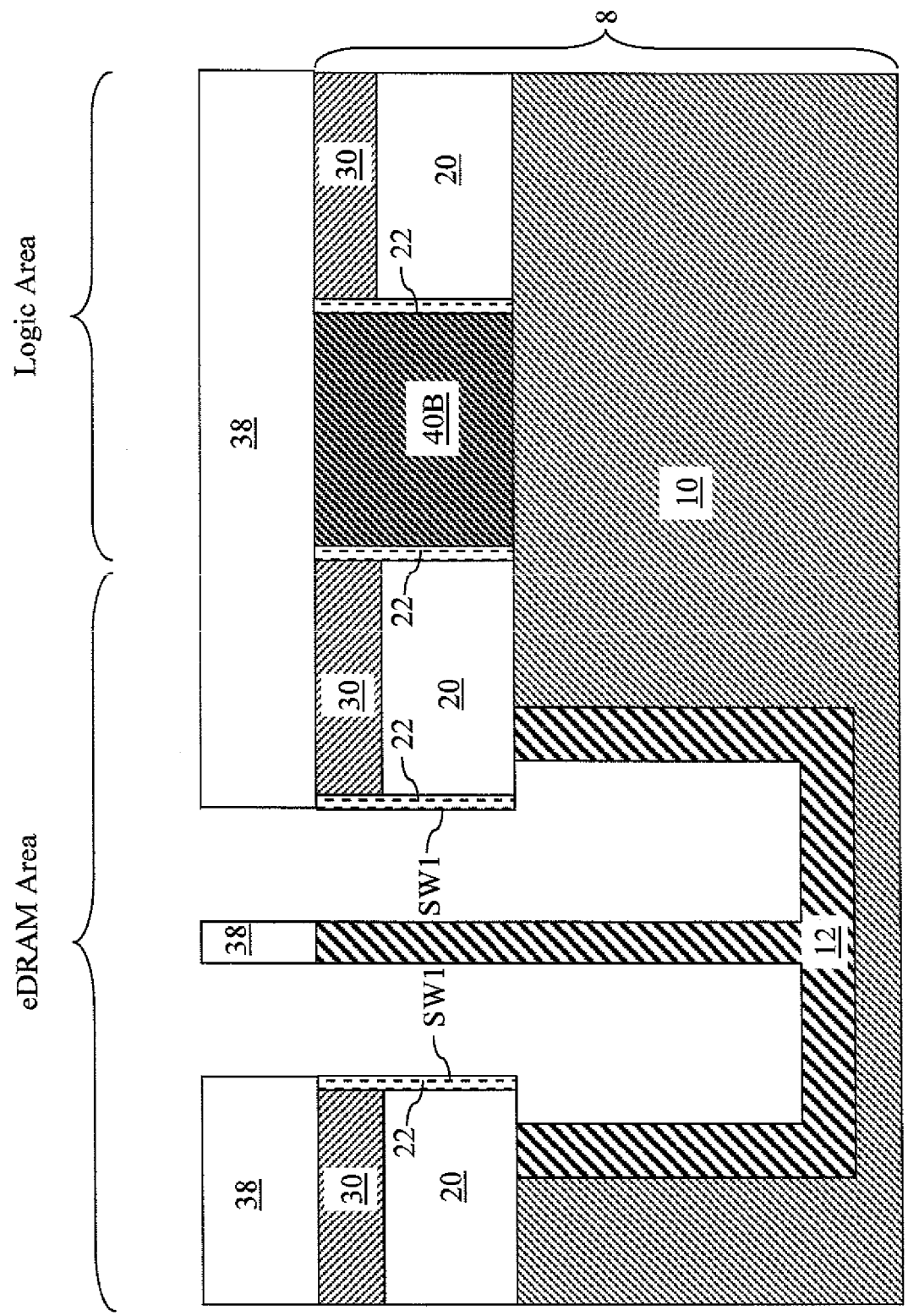

Referring to FIG. 5, electrical dopants are introduced into semiconductor surfaces on the sidewalls of the bottle shaped trenches by methods known in the art including outdiffusion from a dopant containing layer, ion implantation, gas phase doping, plasma doping, plasma immersion ion implantation, infusion doping, liquid phase doping, or a combination thereof. The dopant containing layer may be a dopant containing silicate glass layer such as an arsenosilicate glass (ASG) layer, a borosilicate glass (BSG) layer, or a phosphosilicate glass (PSG) layer. Typical dopants introduced into the semiconductor surfaces include As, P, Sb, B, Ga, and In. Specifically, the electrical dopants are introduced into a portion of the handle substrate 10 adjacent to the second sidewalls SW2 of the bottle shaped trenches and into the first epitaxial semiconductor portion 40A to form a buried plate 12, which has the first crystallographic orientation and is doped with electrical dopants. Typical dopant concentration of the buried plates 12 after subsequent thermal treatments is from about $1.0 \times 10^{19}/cm^3$ to about $1.0 \times 10^{20}/cm^3$, although higher and lower dopant concentrations are explicitly contemplated herein also. While a single buried plate extending across two bottle shaped trenches are shown here, formation of two separate buried plates is also explicitly contemplated herein.

Figure 6:
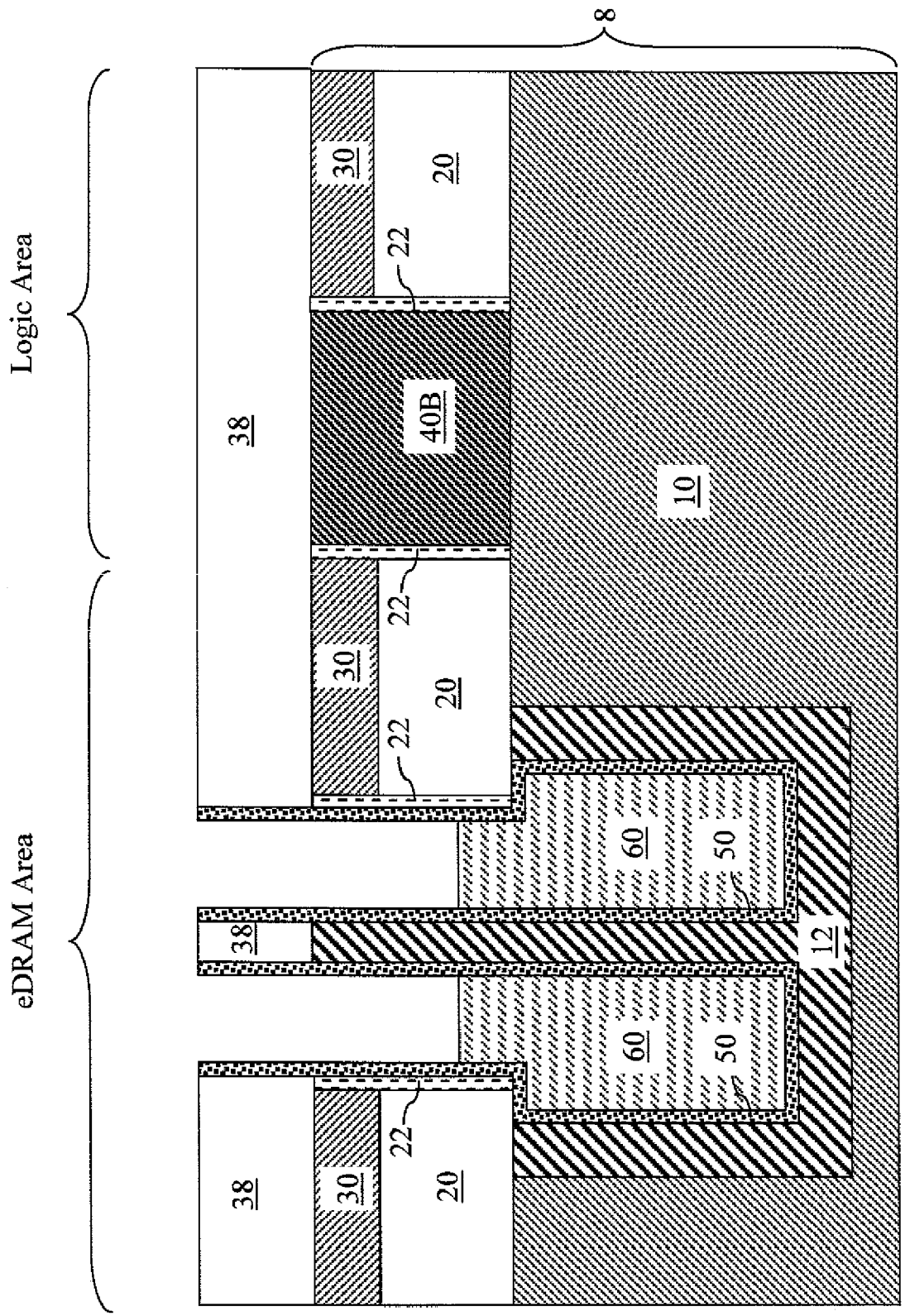

Lateral extent of the buried plates 12, as measured from a second sidewall SW2 of one of the bottle shaped trenches to an outer wall of the buried plate 12 prior to a thermal treatment, may be from about 5 nm to about 200 nm, and typically from about 10 nm to about 100 nm, although lesser and greater lengths are also explicitly contemplated herein. Lateral extent of the buried plates 12 after a subsequent thermal treatment may be from about 5 nm to about 300 nm, and typically from about 20 nm to about 200 nm, although lesser and greater lengths are also explicitly contemplated herein Referring to FIG. 6, a node dielectric 50 is formed directly on the buried plate 12, the outer surfaces of the dielectric spacers 22, and the at least one pad layer 38 by methods known in the art including, but not limited to, thermal oxidation, thermal nitridation, chemical vapor deposition (CVD), atomic layer deposition (ALD), or a combination of thereof. The node dielectric 50 may comprise silicon oxide, silicon nitride, a high-k material having a dielectric constant greater than the dielectric constant of silicon nitride, or any suitable combination of these materials. Exemplary high-k materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2. The thickness of the node dielectric 50 may be from about 3 nm to about 10 nm, although lesser and greater thickness are also explicitly contemplated herein.

A first conductive material portion 60 is formed by deposition of a conductive material on the inner walls of the node dielectric 50, followed by recessing of the conductive material to a depth between the top surface of the buried insulator layer 20 and the bottom surface of the insulator layer 20. The conductive material for the first conductive material portion 60 may include, but are not limited to, polycrystalline or amorphous silicon, germanium, silicon germanium, a metal, a conducting metallic compound material, carbon nanotube, conductive carbon, or any suitable combination of these materials. The conductive material portion 60 may further comprise dopants that are incorporated during or after deposition. The conductive material portion 60 can be deposited by any suitable method, including but not limited to, chemical vapor deposition (CVD), physical vapor deposition (PVD), atomic layer deposition (ALD), vacuum evaporation, sputtering, plating, or a combination thereof.

In case the first conductive material portion 60 comprises a doped semiconductor material, the doped semiconductor material may comprise any material listed above for the handle substrate 10 or the top semiconductor portions 30. The dopants may be a p-type dopant or an n-type dopant. The doped semiconductor material may be deposited by chemical vapor deposition such as low pressure chemical vapor deposition (LPCVD).

In case the first conductive material portion 60 comprises a metal, the metal may be an elemental metal or a conductive metallic alloy. Exemplary elemental metals include Ta, Ti, Co, Cu, Ru, and W. Exemplary conductive metallic alloys include a mixture of elemental metals, a conductive metallic nitride such as TiN, ZrN, HfN, VN, NbN, TaN, WN, TiAlN, TaCN, and an alloy thereof. The first conductive material portion 60 may be formed by chemical vapor deposition (CVD), physical vapor deposition (PVD), atomic layer deposition (ALD), vacuum evaporation, sputtering, plating, etc.

Excess conductive material that is deposited outside the bottle shaped trenches is removed by a recess etch or chemical mechanical planarization. The horizontal portion of the node dielectric 50 above the at least one pad layer 38 may be employed to sense an endpoint during the recess etch, or alternately, may be employed as a stopping layer during the chemical mechanical planarization. Once the excess conductive material is removed outside the bottle shaped trenches, the conductive material in the bottle shaped trenches is recessed by an etch to a depth between the top surface of the buried insulator layer 20 and the bottom surface of the buried insulator layer 20. The horizontal portion of the node dielectric 50 above the at least one pad layer 38 may be removed in this process.

Figure 7:
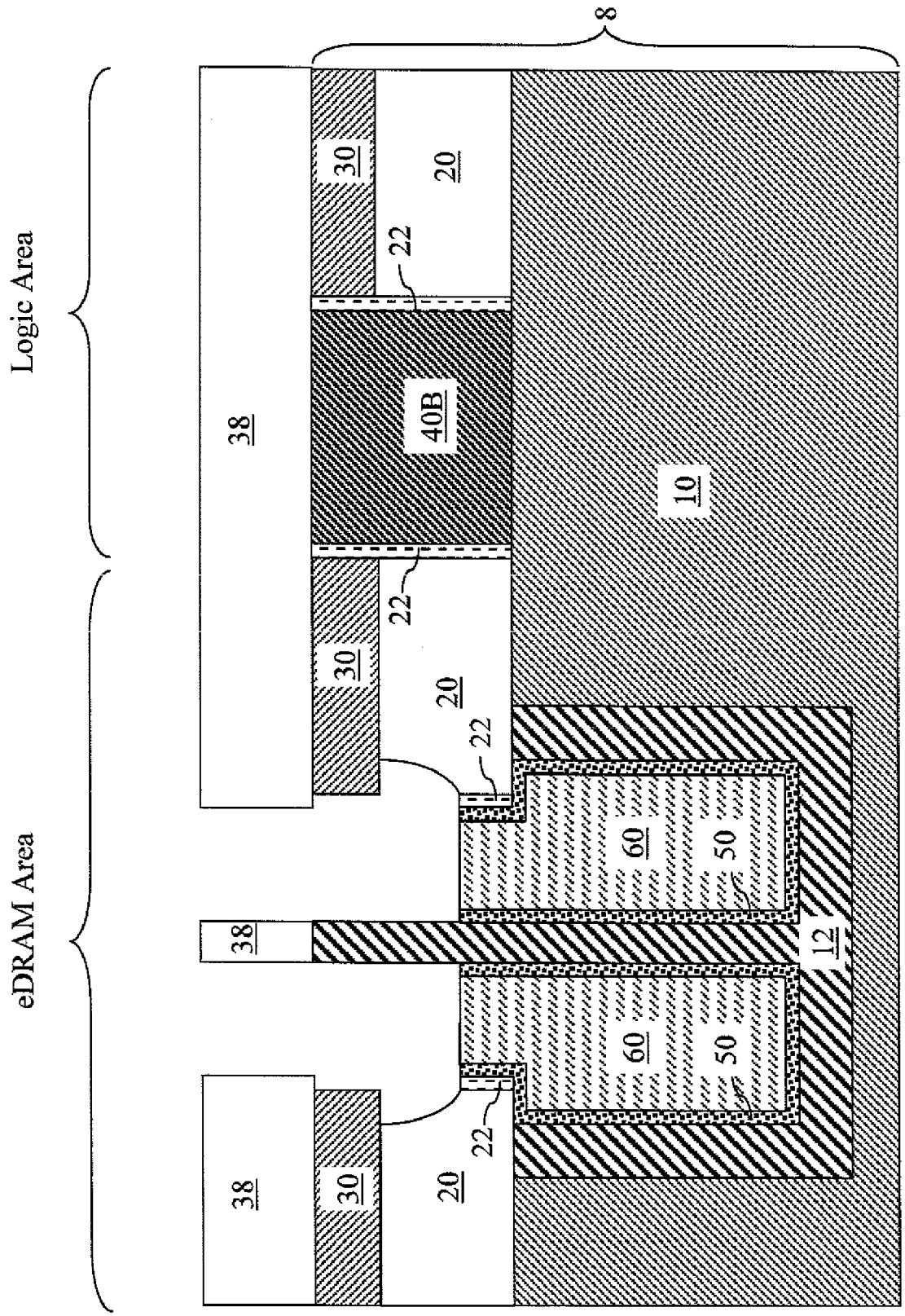

Referring to FIG. 7, the exposed portions of the node dielectric 50 is removed by a wet etch or a dry etch. Preferably, the etch may, or may not, be selective to the at least one pad layer 38. In case the node dielectric 50 comprises silicon nitride, a wet etch employing ethylene glycol and hydrofluoric acid may be employed. Depending on the etch chemistry and composition of the pad nitride layer 50, a fraction of the at least one pad layer 3 may be etched during the removal of the node dielectric 50. The portion of the node dielectric 50 beneath the top surface of the first conductive material portion 60 is protected by the first conductive material portion 60.

The dielectric spacers 22 within the eDRAM area are then removed by another etch, which may be a wet etch or a dry etch. In case the dielectric spacers 22 comprises the same material as the node dielectric 50, the etch employed to remove exposed portions of the node dielectric 50 may be extended to remove the dielectric spacers within the eDRAM area as well. Preferably, this etch is selective to the top semiconductor portions 30.

Optionally, another etch may be employed to undercut edges of the top semiconductor portions 30. Such an undercut increases electrical contact between the top semiconductor portions 30 and second conductive material portions to be subsequently formed.

Figure 8:
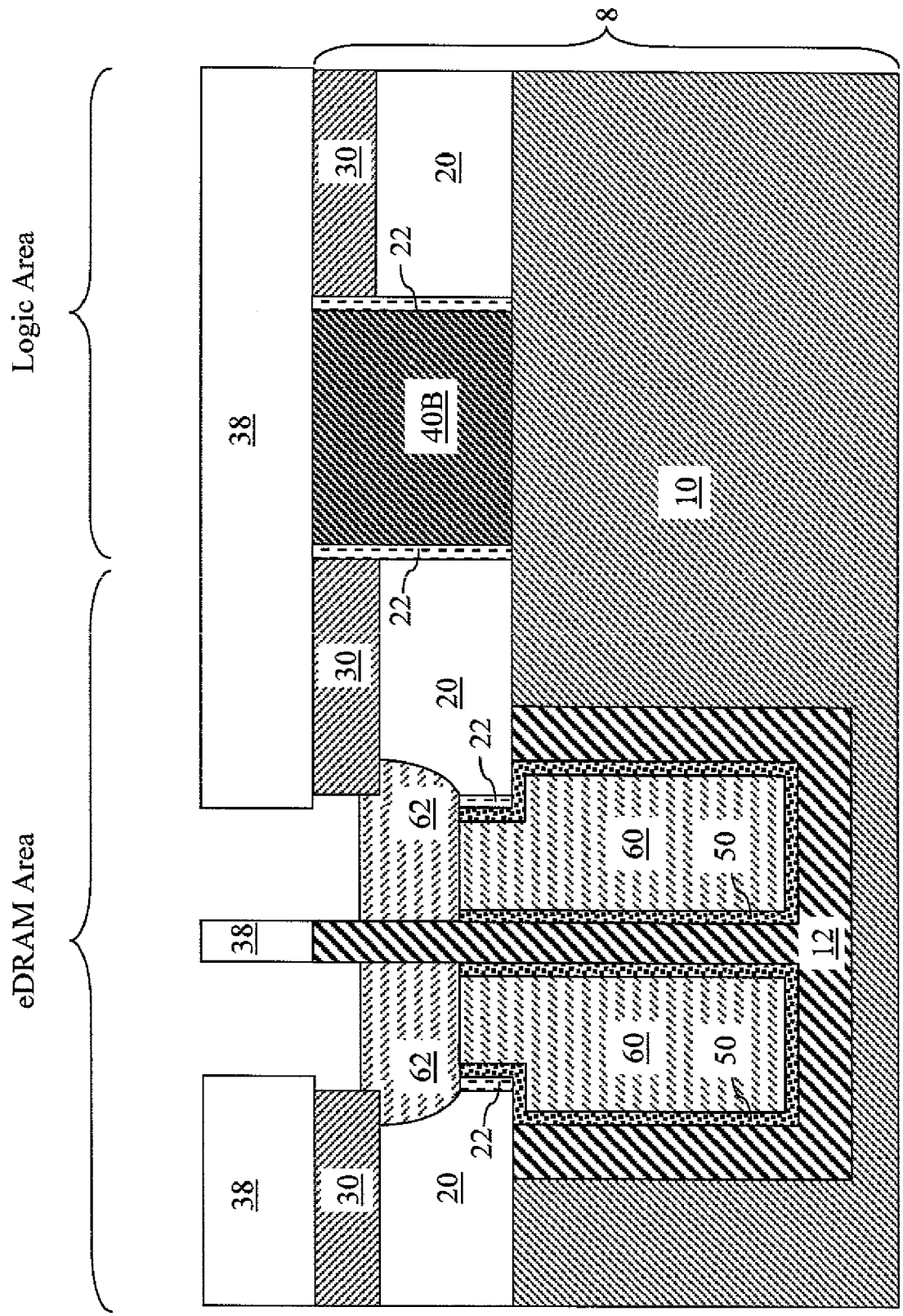

Referring to FIG. 8, second conductive material portions 62, which are commonly referred to as buried straps, are formed by deposition of a doped semiconductor material into the bottle shaped trenches, followed by planarization and recessing of the doped semiconductor material. The doped semiconductor material may comprise any material listed above for the handle substrate 10 or the top semiconductor portions 30. The dopants may be a p-type dopant or an n-type dopant. In case the first conductive material portion 60 comprises another doped semiconductor material, the doping types of the doped semiconductor materials are matched. The doped semiconductor material may be deposited by chemical vapor deposition such as low pressure chemical vapor deposition (LPCVD).

Optionally, a thin dielectric layer (not shown) may be formed before the formation of the second conductive material portions 62. The thin dielectric layer, when present, prevents the defect formation at the interface between the semiconductor layers 30 and the second conductive material portions 62. The thin dielectric layer may have a thickness thin enough to allow dopants to diffuse through it and allow carriers (electrons and holes) to tunneling through it. More specifically, the thin dielectric layer may comprises a thin silicon nitride, silicon carbide, or silicon oxide formed by thermal oxidation, thermal nitridation, chemical oxidation, chemical nitridation, CVD, or ALD process. Preferably, the thin dielectric layer, when present, has a thickness ranging from about 5 to 25 angstroms, and more preferably from 5 to 15 angstroms, and most preferably from 7 to 10 angstroms.

As in the formation of the first conductive material portions 60, excess doped semiconductor material above the at least one pad layer 38 is removed by a recess etch or chemical mechanical planarization. The at least one pad layer 38 may be employed to indicate an endpoint during the recess etch, or alternately, may be employed as a stopping layer during the chemical mechanical planarization. Once the excess doped semiconductor material is removed above the at least one pad layer 38, the doped semiconductor material in the bottle shaped trenches is recessed by a recess etch such that a top surface of the remaining doped semiconductor material at the center of each of the bottle shaped trenches is above the top surface of the buried insulator layer 20. Thus, a top portion of a sidewall of the top semiconductor portions 30 is exposed within each of the bottle shaped trenches. The remaining portion of the doped semiconductor material above the first conductive material portion 60 constitutes the second conductive material portions 62.

Figure 9:
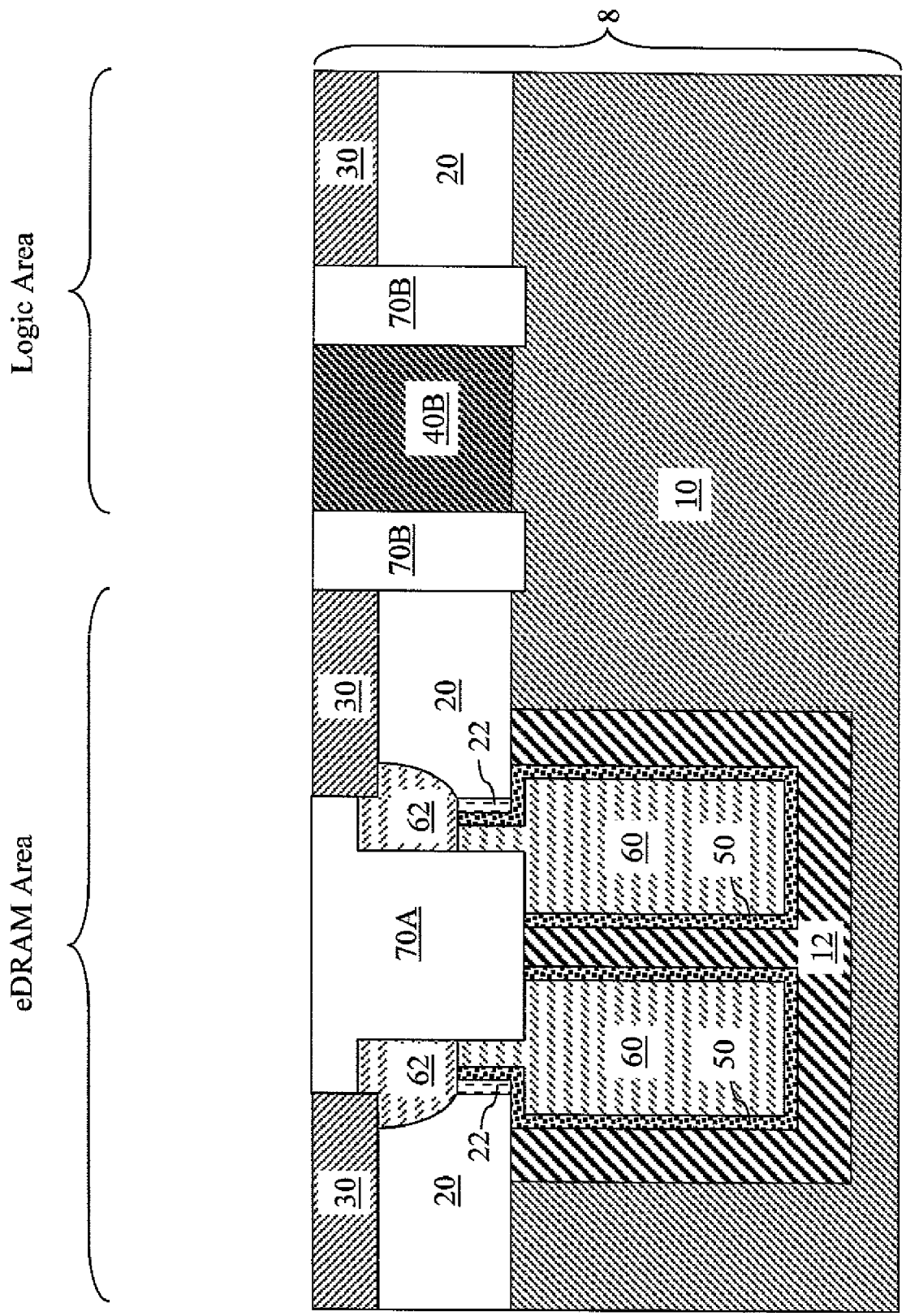

Referring to FIG. 9, shallow trenches are etched straddling a pair of bottles shaped trenches and regions containing any remaining dielectric spacers 22 in the eDRAM area and the logic area. Specifically, a photoresist (not shown) is applied over the at least one pad layer 38, and lithographically patterned to form an opening that covers a contiguous area including a fraction of each of the bottle shaped trenches and the area between the two bottle shaped trenches. Other openings are formed in the photoresist above each of the remaining dielectric spacers 22. Exposed portions of the at least one pad layer 38 within the openings, and the regions of the top semiconductor portions 30, the second conducted material portions 62, and the buried plate 12 underneath the openings are removed by an anisotropic etch to form various shallow trenches. Preferably, the anisotropic etch comprises multiple steps and at least one step is not selective to the buried insulator layer 20.

The photoresist is subsequently removed, for example, by ashing. After a suitable surface clean, the cavity over the pair of the bottles shaped trenches is filled with a dielectric material and planarized to form a first shallow trench isolation structure 70A. Other shallow trenches are filled with the dielectric material to form second shallow trench isolation structures 70B. The dielectric material may comprise a dielectric oxide or a dielectric nitride. For example, the dielectric material may comprise an undoped silicate glass that may be deposited by high density plasma chemical vapor deposition (HDPCVD), low pressure chemical vapor deposition (LPCVD), rapid thermal chemical vapor deposition (RTCVD), or plasma enhanced chemical vapor deposition (PECVD). The first and second shallow trench isolation structures (70A, 70B) may comprise a dielectric liner (not shown) having a different composition than a fill material that is deposited on the dielectric liner.

The dielectric material is planarized employing the at least one pad layer 38 as a stopping layer. The remaining portion of the dielectric material is recessed relative to the at least one pad layer 38 to form the first and second shallow trench isolation structure (70A, 70B). The top surface of the first and second shallow trench isolation structure (70A, 70B) may be substantially coplanar with the top surface of the top semiconductor portions 30, or may be located above or below the top surface of the top semiconductor portions 30. The at least one pad layer 38 is subsequently removed.

Each of the second conductive material portions 62 provides an electrical connection between a first conductive material portion 60 and one of the top semiconductor portions 30 so that a deep trench capacitor formed on a bottle shaped trench by a node dielectric 50, a buried plate 12, and an first conductive material portion 60 may be functionally connected to a device such as a transistor to be formed in the top semiconductor portion 30.

Figure 10:
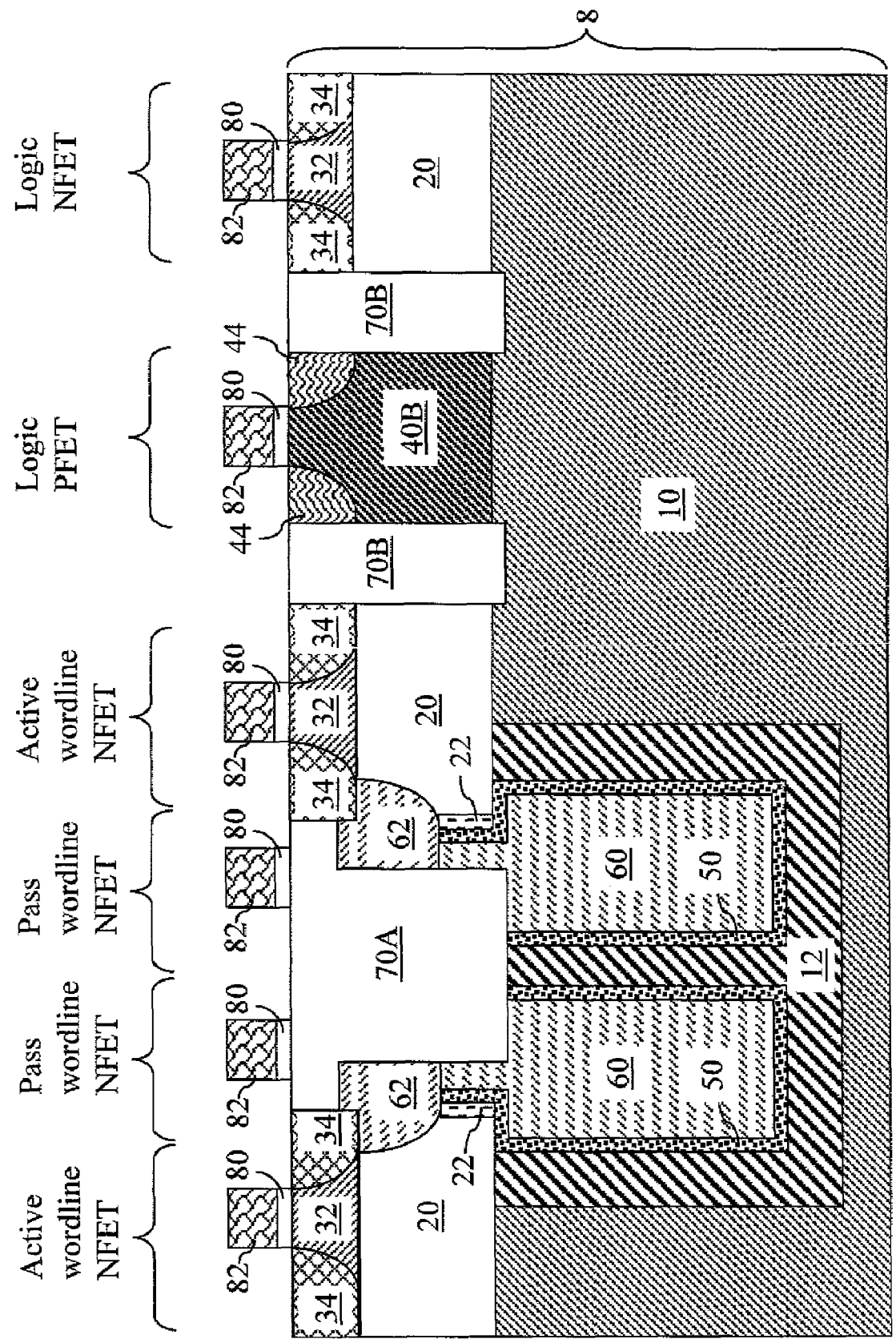

Referring to FIG. 10, gate dielectrics 80 (silicon oxide, silicon nitride, silicon oxynitride, high-k dielectric materials, or a combination thereof) and gate electrodes 82 (doped polycrystalline Si, Ge, SiGe, Si:C, metals, metallic compound, or combination thereof) are formed in the eDRAM area and the logic area employing methods known in the art. First field effect transistors of a first conductivity type comprising first source and drain regions 34 and first bodies 32 are formed on the top semiconductor portion 30. At least one second field effect transistor of a second conductivity type comprising second source and drain regions 44 is formed on the second epitaxial semiconductor portion 40B. The second conductivity type is the opposite of said first conductivity type.

As an illustrative example, the handle substrate 10, the top semiconductor portions 30, and the second epitaxial semiconductor portion 40B comprise silicon, and the handle substrate 10 and the second epitaxial semiconductor portion 40B as a (110) orientation and the top semiconductor portions have a (100) orientation. In this case, the (110) orientation of the second epitaxial semiconductor portion 40B may be employed to enhance performance of a p-type field effect transistor since the mobility of holes is higher on a silicon surface having the (110) surface orientation than a silicon surface having different surface orientations. The (100) orientation of the top semiconductor portions 30 may be employed to enhance performance of a n-type field effect transistors since the mobility of electrons is higher on a silicon surface having the (100) surface orientation than a silicon surface having different surface orientations.

It is herein noted that the reference to the (110) orientation encompasses all equivalent orientations such as (011), (101), etc., since axes of the coordinate system for determining the crystallographic orientation may be re-assigned due to inherent crystallographic symmetry. In the same manner, the reference to the (100) orientation encompasses all equivalent orientations such as (010), (001), etc.

The gate electrodes 82 in the eDRAM area may be connected to other gate electrodes to form word lines, which are referred to active word lines for passive words lines depending on whether the gate electrodes 82 are located over the top semiconductor portions or over the first shallow trench isolation structure 70A. The logic area comprises at least one first field effect transistors of the first conductivity type formed in one of the top semiconductor portions 30 and at least one second field effect transistor of the second conductivity type formed on the second epitaxial semiconductor portion 40B. Thus, the logic area comprises both types of field effect transistors formed on semiconductors surfaces having an optimized crystallographic orientation for enhanced charge carrier mobility.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a deer trench capacitor comprising:
providing a hybrid orientations substrate comprising a handle substrate having a first crystallographic orientation, a buried insulator layer vertically abutting said handle substrate, a to semiconductor portion having a second crystallographic orientation and vertically abutting said insulator layer, a dielectric spacer laterally abutting said buried insulator layer and said to semiconductor portion, and an epitaxial semiconductor portion having the first crystallographic orientation, epitaxially aligned to and vertically abutting said handle substrate, and laterally abutting said dielectric spacer;

forming a substantially straight trench in said epitaxial semiconductor portion and said handle substrate wherein a part of said epitaxial semiconductor remains overlying said dielectric spacer;

laterally expanding said substantially straight trench by removal of material in said epitaxial semiconductor portion and said handles substrate to form a bottled shaped trench, wherein a lateral extent of said bottled shaped trench is limited by said dielectric spacer above an interface between said handle substrate and said buried insulator layer, and wherein of sidewall of said bottles shaped trench laterally extends beyond an outer sidewall of said dielectric spacer below said interface; and forming a buried plate by introducing electrical dopants into a portion of said handle substrate and said epitaxial semiconductor portion located directly on sidewalls of said bottle shaped trench, wherein said dielectric spacer blocks diffusion of said electrical dopants into said top semiconductor portion.

2. The method of claim 1, wherein said electrical dopants are introduced by outdiffusion from a doped silicate glass formed directly on said sidewalls, by ion implantation, gas phase doping, plasma doping, plasma immersion ion implantation, infusion doping, liquid phase doping, or solid phase doping.

3. The method of claim 1, further comprising:
forming a node dielectric on said sidewalls;
forming a first conductive material portion on said node dielectric in said bottle shaped trench, wherein a top surface of said first conductive material portion is located between a top surface of said buried insulator layer and a bottom surface of said buried insulator layer;
removing said node dielectric and said dielectric spacer from above said top surface of said first conductive material portion; and
forming a second conductive material portion abutting said the first conductive material portion and said top semiconductor portion in an upper portion of said bottles shaped trench.

4. The method of claim 3, further comprising undercutting a portion of said buried insulator layer directly beneath said top semiconductor portion, wherein said second conductive material portion vertically abuts a portion of that said top semiconductor portion.

5. The method of claim 3, wherein said handle substrate, said top semiconductor layer, and said epitaxial semiconductor portion comprise silicon and said first crystallographic orientation is a (110) orientation and said second crystallographic orientation is a (100) orientation.

6. The method of claim 1, further comprising:
forming another epitaxial semiconductor portion having said first crystallographic orientation;
forming a first field effect transistor of a first conductivity type on said top semiconductor portion; and
forming a second field effect transistor of a second conductivity type on said another epitaxial semiconductor portion, wherein said second conductivity type is the opposite of said first conductivity type.

7. The method of claim 1, wherein said dielectric spacer comprises silicon nitride.

8. The method of claim 1, wherein said epitaxial semiconductor portion is formed by selective epitaxial growth.

* * * * *